(12) United States Patent
Fridman et al.

(10) Patent No.: US 7,107,302 B1
(45) Date of Patent: Sep. 12, 2006

(54) FINITE IMPULSE RESPONSE FILTER ALGORITHM FOR IMPLEMENTATION ON DIGITAL SIGNAL PROCESSOR HAVING DUAL EXECUTION UNITS

(75) Inventors: Jose Fridman, Brookline, MA (US); Marc Hoffman, Mansfield, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/570,847

(22) Filed: May 12, 2000

Related U.S. Application Data

(60) Provisional application No. 60/133,766, filed on May 12, 1999.

(51) Int. Cl.
*G06F 17/10* (2006.01)

(52) U.S. Cl. .................................. 708/319; 708/300
(58) Field of Classification Search ................ 708/300, 708/323, 319; 375/350, 232
See application file for complete search history.

(56) References Cited

U.S. PATENT DOCUMENTS

| | | | |
|---|---|---|---|
| 4,777,591 A | | 10/1988 | Chang et al. |
| 4,777,612 A | * | 10/1988 | Tomimitsu .................. 708/316 |
| 5,043,868 A | | 8/1991 | Kitamura et al. |
| 5,258,939 A | * | 11/1993 | Johnstone et al. .......... 708/313 |
| 5,282,155 A | * | 1/1994 | Jones .......................... 708/322 |
| 5,297,069 A | * | 3/1994 | Asato et al. ................. 708/319 |
| 5,297,071 A | * | 3/1994 | Sugino ........................ 708/322 |
| 5,311,459 A | * | 5/1994 | D'Luna et al. ............. 708/607 |
| 5,343,404 A | | 8/1994 | Girgis |
| 5,428,741 A | | 6/1995 | Ho et al. |
| 5,500,811 A | * | 3/1996 | Corry ......................... 708/319 |
| 5,502,747 A | * | 3/1996 | McGrath .................... 375/350 |
| 5,517,436 A | | 5/1996 | Andreas et al. |
| 5,532,938 A | | 7/1996 | Kondo et al. |
| 5,588,118 A | | 12/1996 | Mandava et al. |
| 5,590,352 A | | 12/1996 | Zuraski, Jr. et al. |
| 5,613,152 A | | 3/1997 | Van Meerbergen et al. |
| 5,642,382 A | * | 6/1997 | Juan ........................... 375/232 |
| 5,680,335 A | * | 10/1997 | Ikeyama et al. ............ 708/319 |
| 5,710,914 A | | 1/1998 | Verbauwhede et al. |
| 5,748,515 A | | 5/1998 | Glass et al. |

(Continued)

FOREIGN PATENT DOCUMENTS

EP     0 425 410 A     5/1991

(Continued)

OTHER PUBLICATIONS

Staszewski, Finite-impulse-response (FIR) filter employing a parallel architecture, Oct. 17, 2002, U.S. Appl. Publication No. 0152250.*

(Continued)

*Primary Examiner*—Kakali Chaki
*Assistant Examiner*—Chat Do
(74) *Attorney, Agent, or Firm*—Wolf, Greenfield & Sacks, P.C.

(57) ABSTRACT

A computation core includes a computation block, an addressing block and an instruction sequencer, which are coupled to a memory through a memory interface. The computation block includes a register file and dual execution units. The execution units include features for enhanced performance in executing digital signal computations. The computation core is configured for executing digital signal processor instructions and microcontroller instructions, while achieving efficient digital signal processor computation and high code density. A finite impulse response filter algorithm achieves high performance on the dual execution units.

6 Claims, 17 Drawing Sheets

U.S. PATENT DOCUMENTS

| | | | |
|---|---|---|---|
| 5,764,553 | A | 6/1998 | Hong |
| 5,787,025 | A | 7/1998 | Muwafi et al. |
| 5,787,026 | A | 7/1998 | Orenstein et al. |
| 5,790,826 | A | 8/1998 | Thusoo et al. |
| 5,839,108 | A | 11/1998 | Daberko et al. |
| 5,867,726 | A | 2/1999 | Ohsuga et al. |
| 5,896,543 | A | 4/1999 | Garde |
| 5,904,731 | A * | 5/1999 | Matsui ............... 708/319 |
| 5,926,644 | A | 7/1999 | Hays |
| 5,941,940 | A | 8/1999 | Prasad et al. |
| 5,987,490 | A * | 11/1999 | Alidina et al. ............. 708/523 |
| 6,058,408 | A * | 5/2000 | Fischer et al. ............. 708/322 |
| 6,078,941 | A | 6/2000 | Jiang et al. |
| 6,092,184 | A | 7/2000 | Wechsler |
| 6,119,217 | A | 9/2000 | Suzuoki |
| 6,167,497 | A | 12/2000 | Nakatsuka et al. |
| 6,175,370 | B1 | 1/2001 | Kunimatsu |
| 6,175,912 | B1 * | 1/2001 | Alidina et al. ............. 712/222 |
| 6,230,180 | B1 | 5/2001 | Mohamed |
| 6,230,238 | B1 | 5/2001 | Langan et al. |
| 6,230,257 | B1 | 5/2001 | Roussel et al. |
| 6,247,036 | B1 | 6/2001 | Landers et al. |
| 6,260,137 | B1 * | 7/2001 | Fleck et al. ................ 712/225 |
| 6,266,807 | B1 | 7/2001 | McGarity et al. |
| 6,292,886 | B1 | 9/2001 | Makineni et al. |
| 6,321,327 | B1 | 11/2001 | Makineni et al. |
| 6,327,690 | B1 | 12/2001 | Zhang et al. |
| 6,349,382 | B1 | 2/2002 | Feiste et al. |
| 6,425,070 | B1 | 7/2002 | Zou et al. |
| 6,496,705 | B1 | 12/2002 | Ng et al. |
| 6,510,445 | B1 * | 1/2003 | Takano ............... 708/319 |
| 6,532,273 | B1 * | 3/2003 | Mobin et al. ............... 375/350 |
| 6,532,530 | B1 | 3/2003 | Kim et al. |
| 2002/0002574 | A1 | 1/2002 | Jennings, III |
| 2002/0041658 | A1 | 4/2002 | Henderson et al. |
| 2003/0009659 | A1 | 1/2003 | DiSanto et al. |
| 2003/0028743 | A1 | 2/2003 | Catherwood et al. |

FOREIGN PATENT DOCUMENTS

| | | |
|---|---|---|
| EP | 0 741 358 A | 11/1996 |
| EP | 0 789 297 A | 8/1997 |
| EP | 0 901 068 A | 3/1999 |
| WO | WO 99/14663 | 3/1999 |

OTHER PUBLICATIONS

Thomson, Digital filter device, Feb. 2, 1994, European Patent Application No. 0580924A1.*

Conte, T.M., "Challenges to Combining General-Purpose and Multimedia Processors", Computer, US, IEEE Computer Society, Long Beach, CA, vol. 30, No. 12, Dec., 1997, pp. 33-37.

Ernst, R. "Long Pipelines in Single-Chip Digital Signal Processors—Concepts and Case Study", IEEE Transactions on Circuits and Systems, New York, vol. 38, No. 1, 1991, pp. 100-108.

Wakerly, John F., "Digital Design, Principles and Practice", Prentice Hall, 3$^{rd}$Edition, pp. 230-240.

Hennessy and Patterson, "Computer Architecture—A Quantitative Approach", 2$^{nd}$Edition, 1996, pp. 129-130, 132, 153, 189-190 and 201-202.

Patterson, D.A., "CS152 Computer Architecture and Engineering"—Midterm II, University of California, Berkeley, Oct. 19, 1997, pp. 11-15.

* cited by examiner

```
For n=0 to M/2 do              // Outer do-loop for filter for M/2 iterations
                               // ( 2 outputs are computed per pass)
  RL0 = x(0);                  // 16-bit data element loaded into RL0

For k=0 to L-1 do            // Inner do-loop which performs the filter summation
                               // ( 2 outputs are computed per pass)
    RH0 = x(n+k+1);            // 16-bit data element loaded into RH0

R1 = {c(k+1), c(k)};       // two 16-bit coefficients loaded into R1

A1 += RH0 * RL1;           // accumulate output z(n+1) += c(k)*x(n+k+1)
    A0 += RL0 * RL1;           // accumulate output z(n)   += c(k)*x(n+k)

RL0 = x(n+k+2);            // 16-bit data element loaded into RL0

A1 += RL0 * RH1;           // accumulate output z(n+1) += c(k+1)*x(n+k+2)
    A0 += RH0 * RH1;           // accumulate output z(n)   += c(k+1)*x(n+k+1)

End-k

End-n
```

*FIG. 16*

FINITE IMPULSE RESPONSE FILTER ALGORITHM FOR IMPLEMENTATION ON DIGITAL SIGNAL PROCESSOR HAVING DUAL EXECUTION UNITS

CROSS REFERENCE TO RELATED APPLICATION

This application claims the benefit of provisional application Ser. No. 60/133,766, filed May 12, 1999, which is hereby incorporated by reference.

FIELD OF THE INVENTION

This invention relates to digital signal processors and, more particularly, to a finite impulse response filter algorithm that operates efficiently on a digital signal processor having dual execution units.

BACKGROUND OF THE INVENTION

A digital signal computer, or digital signal processor (DSP), is a special purpose computer that is designed to optimize performance for digital signal processing applications, such as, for example, Fast Fourier transforms, digital filters, image processing and speech recognition. Digital signal processor applications are typically characterized by real-time operation, high interrupt rates and intensive numeric computations. In addition, digital signal processor applications tend to be intensive in memory access operations and to require the input and output of large quantities of data. Digital signal processor architectures are typically optimized for performing such computations efficiently.

Microcontrollers, by contrast, involve the handling of data but typically do not require extensive computation. Microcontroller application programs tend to be longer than DSP programs. In order to limit the memory requirements of microcontroller application programs, it is desirable to provide a high degree of code density in such programs. Thus, architectures that are optimized for DSP computations typically do not operate efficiently as microcontrollers. Also, microcontrollers typically do not perform well as digital signal processors. Nonetheless, a particular application may require both digital signal processor and microcontroller functionality.

Digital signal processor designs may be optimized with respect to different operating parameters, such as computation speed and power consumption, depending on intended applications. Furthermore, digital signal processors may be designed for 16-bit words, 32-bit words, or other word sizes. A 32-bit architecture that achieves very high operating speed is disclosed in U.S. Pat. No. 5,954,811 issued Sep. 21, 1999 to Garde.

Digital signal processors frequently utilize architectures wherein two or more data words are stored in each row of memory, and two or more data words are provided in parallel to the computation unit. Such architectures provide enhanced performance, because several instructions and/or operands may be accessed simultaneously.

Notwithstanding the performance levels of current digital signal processors, there is a need for further enhancements in digital signal processor performance.

SUMMARY OF THE INVENTION

According to a first aspect of the invention, a computation unit is provided. The computation unit is preferably configured for performing digital signal processor computations. The computation unit comprises an execution unit for performing an operation on a first operand and a second operand in response to an instruction, a register file for storing operands, first and second operand buses coupled to the register file, and first and second data selectors. The first and second operand buses each carry a high operand and a low operand. The first data selector supplies the high operand or the low operand from the first operand bus to the execution unit in response to a first operand select value contained in the instruction. The second data selector supplies the high operand or the low operand from the second operand bus to the execution unit in response to a second operand select value contained in the instruction.

The execution unit may comprise an arithmetic logic unit, a multiplier and an accumulator. In one embodiment, the register file comprises first and second register banks, each having two read ports and two write ports. In another embodiment, the register file comprises a single register bank having four read ports and four write ports.

According to another aspect of the invention, a computation unit is provided. The computation unit comprises an execution unit for performing an operation on first and second operands in response to an instruction, a register file for storing operands, an operand bus coupled to the register file, the operand bus carrying a high operand and a low operand, and a data selector, responsive to an operand select value contained in the instruction, for supplying the high operand or the low operand from the operand bus to the execution unit.

According to another aspect of the invention, a method is provided for performing a digital computation. The method comprises the steps of storing operands for the computation in a register file, supplying operands from the register file on first and second operand buses, each carrying a high operand and a low operand, selecting the high operand or the low operand from the first operand bus in response to a first operand select value contained in an instruction and supplying a selected first operand to the execution unit, selecting the high operand or the low operand from the second operand bus in response to a second operand select value contained in the instruction and supplying a selected second operand to the execution unit, and performing an operation specified by the instruction on the operands selected from the first and second operand buses.

According to another aspect of the invention, a digital signal processor computation unit is provided. The digital signal processor computation unit comprises first and second execution units for performing operations in response to an instruction and for producing first and second results, a result register for storing the results of the operations, the result register having first and second locations, and result swapping logic, coupled between the first and second execution units and the result register, for swapping the first and second results between the first and second locations in the result register in response to result swapping information contained in the instruction.

The first and second execution units may comprise first and second arithmetic logic units for performing add and subtract operations. The first and second execution units are separately controllable and may perform the same or different operations in response to operation code information contained in the instruction. The first and second arithmetic logic units may comprise 16-bit arithmetic logic units which are configurable as a 32-bit arithmetic logic unit. The first and second locations in the result register may comprise high and low halves of the result register. The result register may comprise a register in a register file.

According to another aspect of the invention, a method is provided for performing digital signal computations. The method comprises the steps of performing operations in first and second execution units in response to an instruction and producing first and second results, storing the results of the operations in a result register having first and second locations, and swapping the first and second results with respect to the first and second locations in the result register, in response to result swapping control information contained in the instruction.

According to another aspect of the invention, a digital signal processor computation unit is provided. The digital signal processor computation unit comprises first and second execution units for performing operations in response to an instruction and for producing first and second results, a result register for storing the results of the operations, the result register having first and second locations, and means for swapping the first and second results with respect to the first and second locations in the result register, in response to result swapping control information contained in the instruction.

According to another aspect of the invention, a digital signal processor computation core is provided. The digital signal processor computation core comprises first and second execution units for performing first and second operations in response to control signals, and control logic for providing the control signals to the first and second execution units in response to control information contained in an instruction for individually controlling the first and second operations.

In one example, the first and second execution units comprise first and second arithmetic logic units. The first and second operations may be selected from add operations and subtract operations, and may be the same or different.

The computation core may further comprise a register file for storing operands and results of the first and second operations, and first and second operand buses coupled between the register file and the first and second execution units, each of the first and second operand buses carrying a high operand and a low operand, wherein the first execution unit performs the first operation on the high operands and the second execution unit performs the second operation on the low operands.

According to another aspect of the invention, a method is provided for performing digital signal computations. The method comprises the steps of performing first and second operations in first and second execution units, and individually controlling the first and second operations in response to control information contained in an instruction.

According to a further aspect of the invention, a digital signal processor computation core is provided. The digital signal processor computation core comprises first and second execution units for performing first and second operations in response to control signals, and means responsive to control information contained in an instruction for providing the control signals to the first and second execution units for individually controlling the first and second operations, wherein the first and second operations may be the same or different.

According to a further aspect of the invention, a computation core is provided for executing programmed instructions. The computation core comprises an execution block for performing digital signal processor operations in response to digital signal processor instructions and for performing microcontroller operations in response to microcontroller instructions, a register file for storing operands for and results of the digital signal processor operations and the microcontroller operations, and control logic for providing control signals to the execution block and the register file in response to the digital signal processor instructions and the microcontroller instructions for executing the digital signal processor instructions and the microcontroller instructions.

Preferably, the digital signal processor instructions are configured for high efficiency digital signal computations, and the microcontroller instructions are configured for code storage density. In one example, the microcontroller instructions have a 16-bit format and the digital signal processor instructions have a 32-bit format. The digital signal processor instructions may contain information indicating whether one or more related instructions follow. The related instructions may comprise load instructions.

According to a further aspect of the invention, a method is provided for executing programmed instructions. The method comprises the steps of executing digital signal processor operations in an execution block in response to digital signal processor instructions configured for efficient digital signal computation, and executing microcontroller operations in the execution block in response to microcontroller instructions configured for code storage density. An application program having a mixture of digital signal processor instructions and microcontroller instructions is characterized by high code storage density and efficient digital signal computation.

According to another aspect of the invention, a digital signal processor having a pipeline structure is provided. The digital signal processor comprises a computation block for executing computation instructions, the computation block having one or more computation stages of the pipeline structure, and a control block for fetching and decoding the computation instructions and for accessing a memory, the control block having one or more control stages of the pipeline structure. The computation stages and the control stages are positioned in the pipeline structure such that a result of the memory access is available to the computation stages without stalling the computation stages.

The computation stages and the control stages may be positioned in the pipeline structure so as to avoid stalling the computation stages when a computation instruction immediately follows a memory access instruction and requires the result of the memory access instruction. The computation stages and the control stages may be positioned in the pipeline structure such that the control block has one or more idle stages following completion of the memory access. The computation stages and the control stages may be positioned in the pipeline structure such that the computation block has one or more idle stages prior to a first computation stage.

According to another aspect of the invention, a method is provided for a digital signal computation. The method comprises the steps of executing computation operations in a computation block having one or more computation stages, executing control operations, including fetching instructions, decoding instructions and accessing a memory, in a control block having one or more control stages, wherein the computation stages and the control stages are configured in a pipeline structure, and positioning the computation stages relative to the control stages in the pipeline structure such that a result of a memory access is available to the computation stages without stalling the computation stages.

According to a further aspect of the invention, a method is provided for determining an output of a finite impulse response digital filter having L filter coefficients in response to a set of M input samples. The method comprises the steps of (a) loading a first input sample into a first location in a first register, (b) loading a second input sample into a second location in the first register, (c) loading two coefficients into a second register, (d) computing intermediate results using the contents of the first and second registers, (e) loading a new input sample into the first location in the first register, (f) computing intermediate results using the contents of the first and second registers, (g) repeating steps (b)–(f) for L iterations to provide two output samples, and (h) repeating steps (a)–(g) for M/2 iterations to provide M output samples.

Step (d) may comprise a multiply accumulate operation on a first coefficient in the second register and the input sample in the first location in the first register, and a multiply accumulate operation on the first coefficient in the second register and the input sample in the second location in the first register. Step (f) may comprise a multiply accumulate operation on a second coefficient in the second register and the input sample in the first location in the first register, and a multiply accumulate operation on the second coefficient in the second register and the input sample in the second location in the first register.

It will be understood that the foregoing aspects of the invention may be practiced separately or in any combination.

BRIEF DESCRIPTION OF THE DRAWINGS

For a better understanding of the present invention, reference is made to the accompanying drawings, which are incorporated herein by reference and in which:

FIG. 16 shows pseudo-code for an example of an FIR digital filter algorithm that may run efficiently on the computation core of FIG. 1.

DETAILED DESCRIPTION

Figure 1:
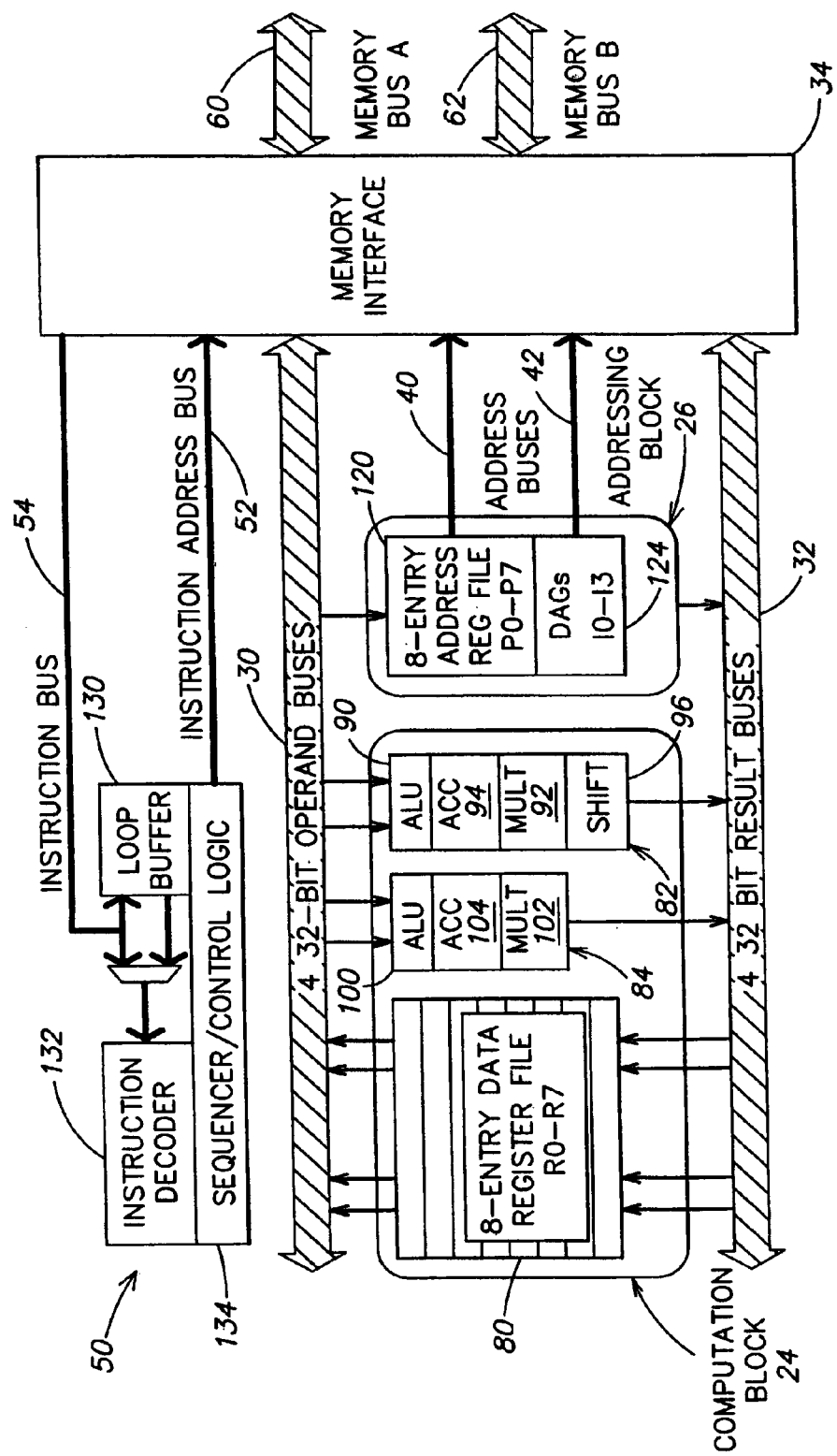
FIG. 1 is a block diagram of a computation core in accordance with an embodiment of the invention.
Figure 2:
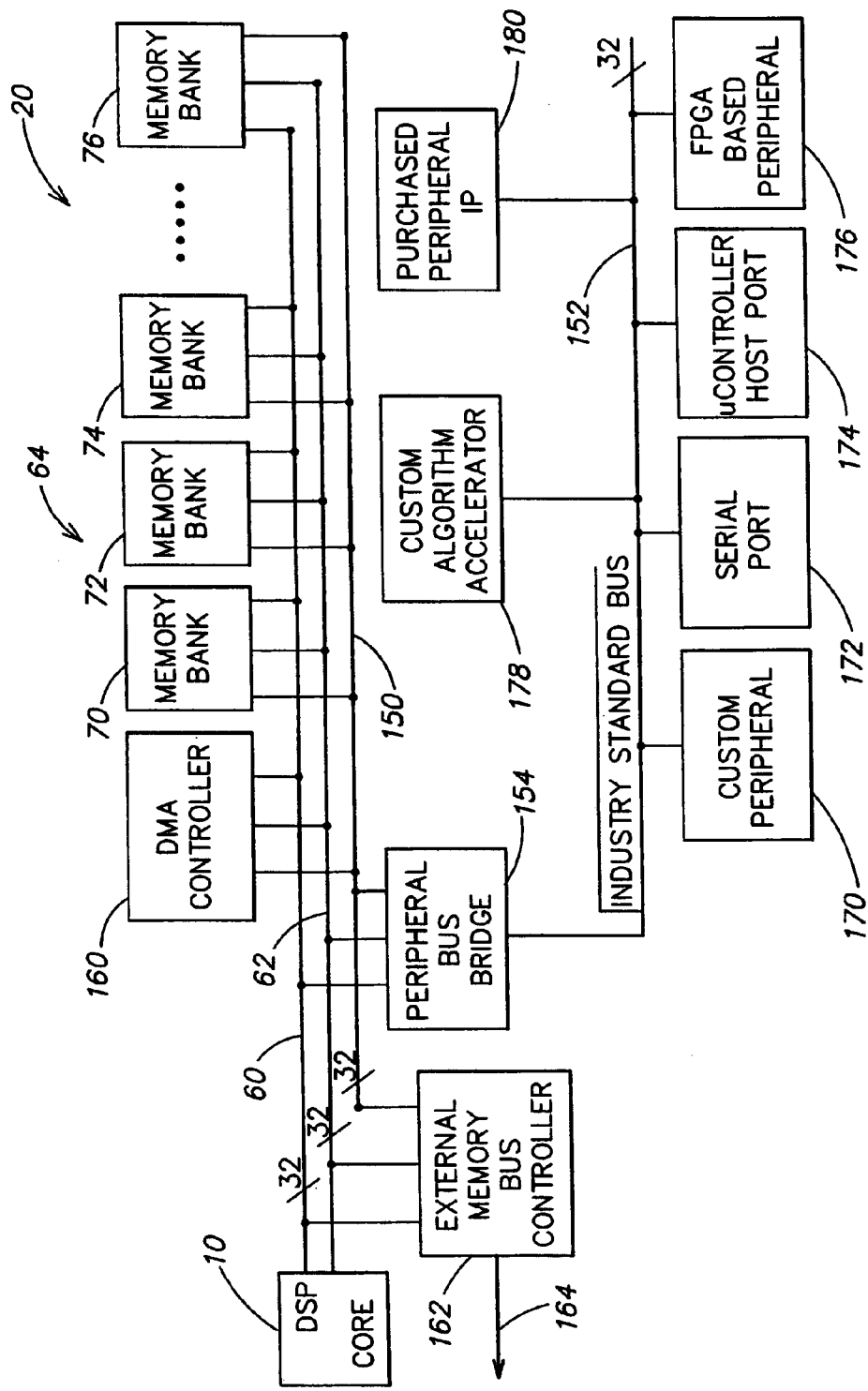
FIG. 2 is a block diagram of a digital signal processor incorporating the computation core of FIG. 1.

A block diagram of an embodiment of a computation core 10 in accordance with the invention is shown in FIG. 1. A block diagram of a digital signal processor 20 incorporating computation core 10 is shown in FIG. 2. Preferably, digital signal processor 20 is implemented as a monolithic integrated circuit which incorporates computation core 10.

Computation core 10 includes a computation block 24 and an addressing block 26 coupled through operand buses 30 and result buses 32 to a memory interface 34. Address buses 40 and 42 are coupled between addressing block 26 and memory interface 34. Computation core 10 further includes an instruction sequencer 50 coupled by an instruction address bus 52 and an instruction bus 54 to memory interface 34. Memory interface 34 is connected by memory buses 60 and 62 to a memory 64 (FIG. 2), including memory banks 70, 72, 74 and 76, located external to computation core 10.

As shown in FIG. 1, computation block 24 includes a register file 80 and execution units 82 and 84, each of which are connected to operand buses 30 and result buses 32. Execution unit 82 (execution unit 0) includes an arithmetic logic unit (ALU) 90, a multiplier 92, an accumulator 94, and a shifter 96. Execution unit 84 (execution unit 1) includes an ALU 100, a multiplier 102, and an accumulator 104. The structure and operation of computation block 24 are described in detail below.

The addressing block 26 includes an address register file 120 and data address generators 124. In a preferred embodiment, address register file 120 has a capacity of 8 address values. The address register file 120 may be used for microcontroller programs that require simple addressing, and may access different word widths (8-bit bytes, 16-bit half words, and 32-bit words). The addressing block 26 may include four data address generators (DAGs) 124 for generating address sequences or patterns. The addresses generated by addressing block 26 are supplied through address buses 40 and 42, memory interface 34 and memory buses 60 and 62 to memory 64 (FIG. 2).

Instruction sequencer 50 includes a loop buffer 130, an instruction decoder 132 and sequencer/control logic 134. Instructions are received from memory 64 through one of the memory buses 60 or 62 and are delivered to the instruction sequencer 50 via instruction bus 54. The instructions are temporarily stored in loop buffer 130. The loop buffer 130 is used for implementing repetitive code sequences with no overhead. The instructions are decoded in the instruction decoder 132 and are interpreted by the sequencer/control logic 134 to control operations by the rest of the computation core.

The integration of computation core 10 into digital signal processor 20 is shown in FIG. 2. Core 10 is connected to the other elements of the digital signal processor 20 through memory buses 60 and 62. The digital signal processor 20 may further include a memory bus 150, which is not connected to computation core 10 and an industry standard bus 152, also not connected to computation core 10. Standard bus 152 may, for example, be a Peripheral Components Interconnect (PCI) bus and may be connected to memory buses 60, 62 and 150 through a peripheral bus bridge 154. As shown, memory buses 60, 62 and 150 are connected to memory banks 70, 72, 74 and 76, peripheral bus bridge 154, a DMA controller 160 and an external memory bus controller 162. The external memory bus controller 162 permits the digital signal processor 20 to be connected to an external memory via an external memory bus 164. The standard bus 152 may be connected to a custom peripheral interface 170, a serial port 172, a microcontroller host port 174, an FPGA (field programmable gate array) based peripheral 176, a custom algorithm accelerator 178 and a purchased peripheral interface 180. It will be understood that different elements may be added to or removed from the digital signal processor 20 for different applications.

Figure 3:
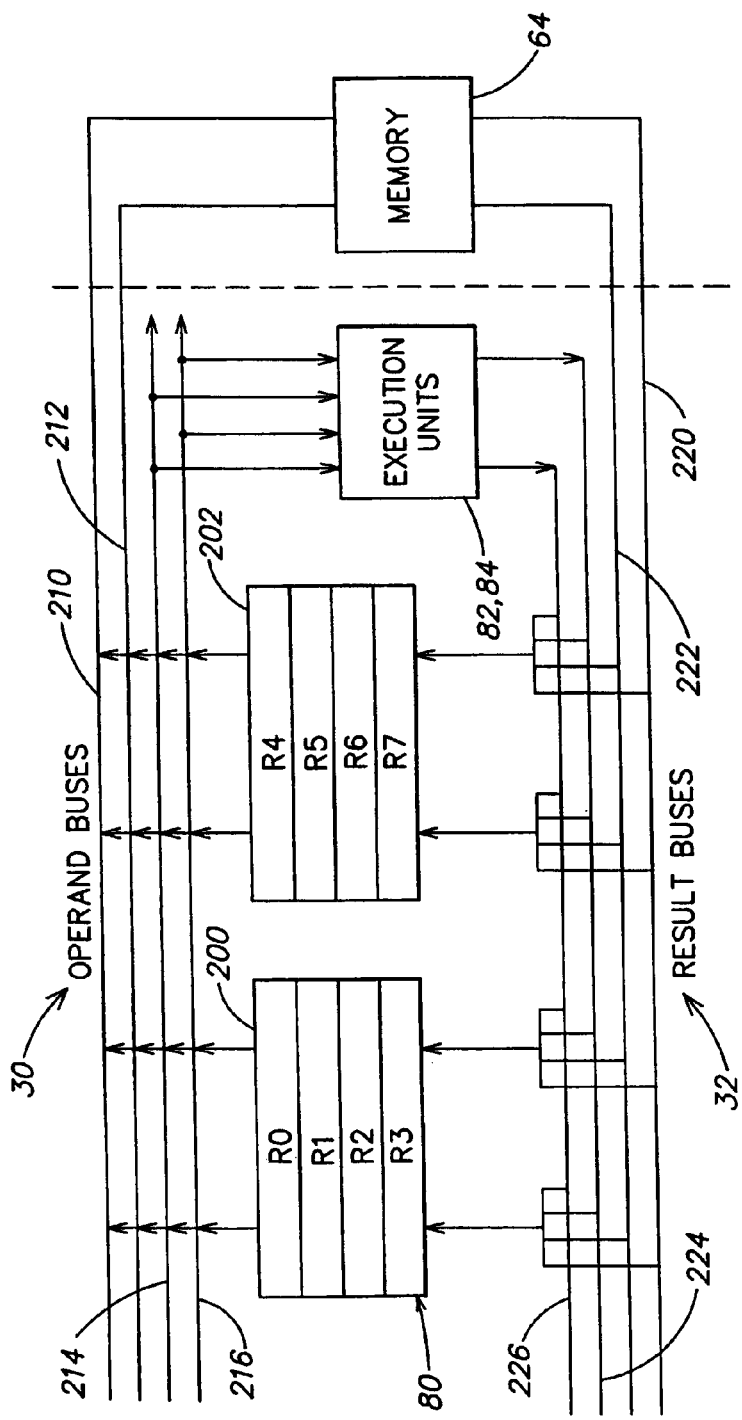
FIG. 3 is a more detailed block diagram of a portion of the computation core, showing a first embodiment of the register file.

A block diagram of a first embodiment of register file 80, execution units 82 and 84 and memory 64, and the interconnection between these elements, is shown in FIG. 3. In the embodiment of FIG. 3, register file 80 has eight registers and is partitioned into register file banks 200 and 202, each having four registers of 32 bits each. Thus, register file bank 200 contains registers R0–R3, and register file bank 202 contains registers R4–R7. This arrangement results in low power because each four entry register file bank 200, 202 requires less energy per access than a single eight entry register file. Each four entry register file bank 200, 202 requires two read ports and two write ports, while an eight entry register file requires four read ports and four write ports.

Register file 80 is connected to execution units 82 and 84 and to memory 64 by operand buses 30 and result buses 32. Operand buses 30 include operand bus 210, operand bus 212, operand bus 214 and operand bus 216. Operand buses 210 and 212 are connected between register file banks 200 and 202 and memory 64 for writing results of computations to memory. In another embodiment, a single operand bus may be used for writing data from register file 80 to memory 64. Operand buses 214 and 216 are connected between register file banks 200 and 202 and execution units 82 and 84 for supplying operands to execution units 82 and 84. Result buses 32 include result bus 220, result bus 222, result bus 224 and result bus 226. Result buses 220 and 222 are connected between memory 64 and register file banks 200 and 202 for reading operands from memory 64. Result buses 224 and 226 are connected between execution units 82 and 84 and register file banks 200 and 202 for writing results of computations in register file 80. In a preferred embodiment, each of operand buses 210, 212, 214 and 216 and each of result buses 220, 222, 224 and 226 is 32 bits wide. As described above, memory 64 is external to computation core 10. Thus, the connections to memory 64 are via memory interface 34 and memory buses 60 and 62, as described above in connection with FIGS. 1 and 2.

Figure 3A:
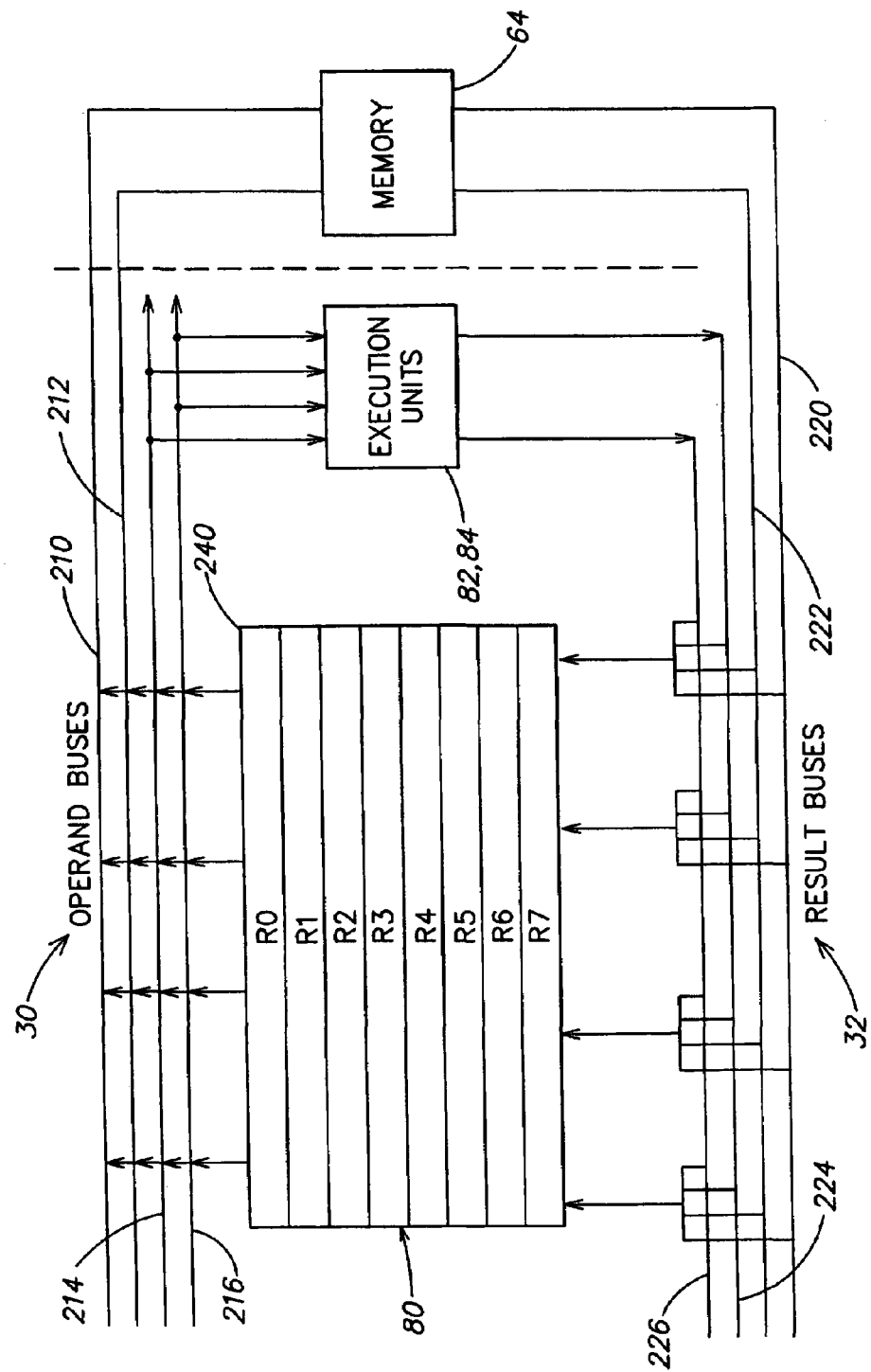
FIG. 3A is a more detailed block diagram of a portion of the computation core, showing a second embodiment of the register file.

A block diagram of a second embodiment of register file 80, execution units 82 and 84 and memory 64, and the interconnection between these elements, is shown in FIG. 3A. Like elements in FIGS. 3 and 3A have the same reference numerals. In the embodiment of FIG. 3A, register file 80 has a single register file bank 240 having eight registers, R0–R7, of 32 bits each. Register file bank 240 has four read ports and four write ports.

Figure 4:
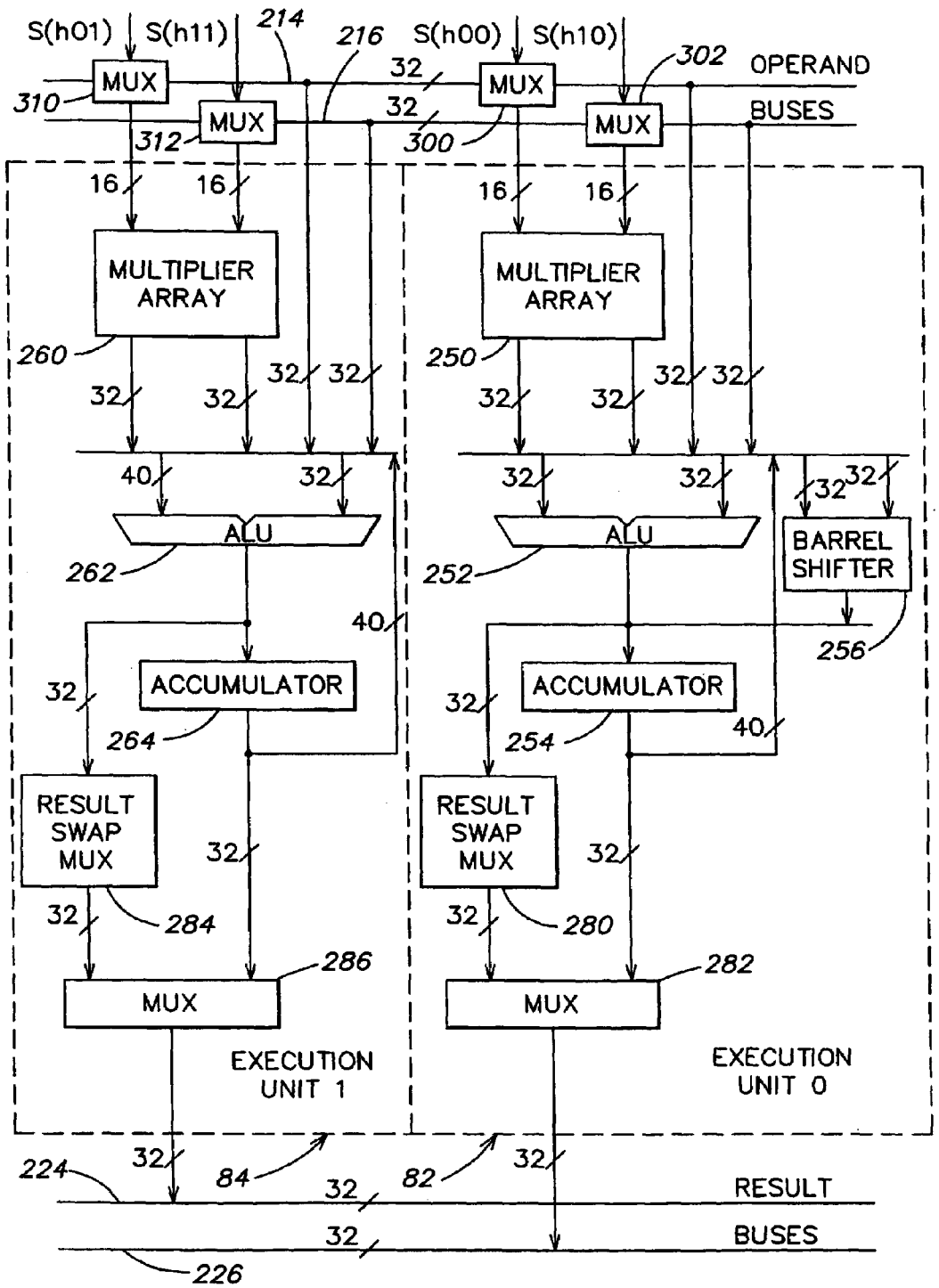
FIG. 4 is a block diagram of the execution units shown in FIG. 1.

A block diagram of execution units 82 and 84 is shown in FIG. 4. A portion of execution unit 82 is shown in more detail in FIG. 4A. Execution unit 82 includes a multiplier array 250, an ALU 252, an accumulator 254 and a barrel shifter 256. Execution unit 84 includes a multiplier array 260, an ALU 262 and an accumulator 264. Each multiplier array 250, 260 receives two 16-bit operands and provides two 32-bit outputs to the respective ALUs 252, 262. ALUs 252 and 262 may also receive two 32-bit inputs from operand buses 214 and 216. In a preferred embodiment, ALUs 252 and 262 are 40-bit ALUs. The output of ALU 252 is connected to accumulator 254 and is connected through a result swap mux (multiplexer) 280 to one input of an output select mux 282. The output of accumulator 254 is connected to a second input of output select mux 282 and is connected to an input of ALU 252. Similarly, the output of ALU 262 is connected to accumulator 264 and is connected through a result swap mux 284 to an output select mux 286. The output of accumulator 264 is connected to a second input of output select mux 286 and to an input of ALU 262. The output of output select mux 282 is connected to result bus 226, and the output of output select mux 286 is connected to result bus 224.

In multiply operations, the multiplier arrays 250 and 260 and the ALUs 252 and 262 are utilized. In multiply accumulate (MAC) operations, multiplier arrays 250 and 260, ALU's 252 and 262 and accumulators 254 and 264 are utilized. In add/subtract operations, ALUs 252 and 262 are utilized. The appropriate outputs are selected by output select muxes 282 and 286 and are supplied on result buses 226 and 224 to register file 80. The operations of the execution units 82 and 84 are described in more detail below.

It will be understood that FIG. 4 shows only the data paths in the execution units 82 and 84. Each element of execution units 82 and 84 receives control signals from the sequencer/control logic 134 (FIG. 1) for controlling operations in accordance with instructions being executed.

Each of the operand buses 214 and 216 is 32 bits wide and carries two 16-bit operands, designated as a high operand and a low operand. The computation block 24 is preferably provided with an arrangement of data selectors which permits the multiplier in each of execution units 82 and 84 to select the high or low operand from each of the operand buses 214 and 216. As shown in FIG. 4, a mux (data selector) 300 selects the high operand or the low operand from operand bus 214 for input to multiplier array 250, and a mux 302 selects the high operand or the low operand from operand bus 216 for input to multiplier array 250. Similarly, a mux 310 selects the high operand or the low operand from operand bus 214 for input to multiplier array 260, and a mux 312 selects the high operand or the low operand from operand bus 216 for input to multiplier array 260. The select inputs to muxes 300, 302, 310 and 312 are controlled in response to information contained in instructions as described below. This arrangement for selecting operands provides a high degree of flexibility in performing digital signal computations.

Figure 5:
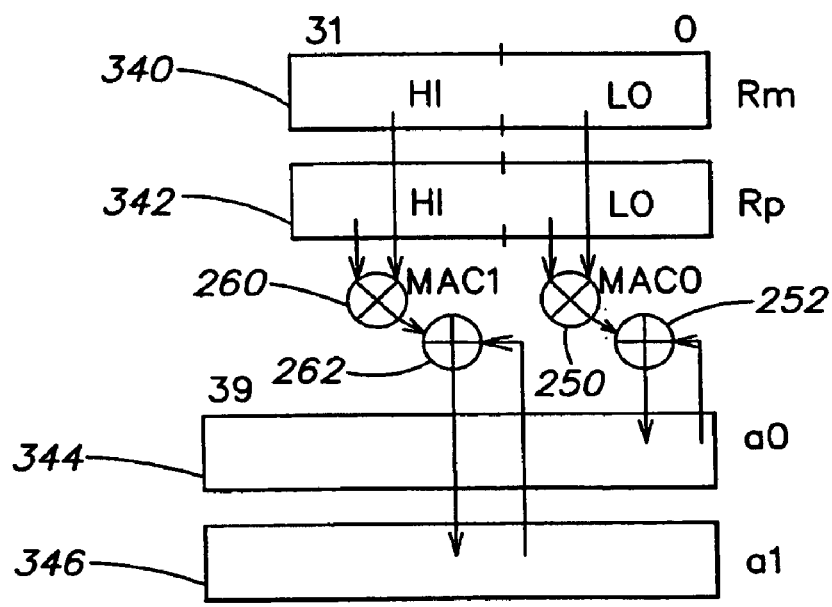
FIG. 5 schematically illustrates an example of the operation of the multiplier/accumulators in the execution units.

A schematic representation of a dual multiply accumulate operation by execution units 82 and 84 is shown in FIG. 5. Like elements in FIGS. 4 and 5 have the same reference numerals. A 32-bit data element 340 represents the operands supplied from register file 80 on operand bus 214, and a 32-bit data element 342 represents the operands supplied from register file 80 on operand bus 216. A 40-bit data element 344 represents the contents of accumulator 254, and a 40-bit data element 346 represents the contents of accumulator 264. Multiplier array 250 receives the low operands from data elements 340 and 342 and supplies an output to ALU 252. ALU 252 adds the output of multiplier array 250 and data element 344 and places the result in accumulator 254 as a new data element 344. Similarly, multiplier array 260 receives the high operands from data elements 340 and 342 and supplies an output to ALU 262. ALU 262 adds the output of multiplier array 260 and data element 346 from accumulator 264 and places the result in accumulator 264 as a new data element 346.

In the example of FIG. 5, muxes 300 and 302 (FIG. 4) select the low. operands from operand buses 214 and 216 and supply the low operands to multiplier array 250. Muxes 310 and 312 select the high operands from operand buses 214 and 216 and supply the high operands to multiplier array 260.

Figure 6A:
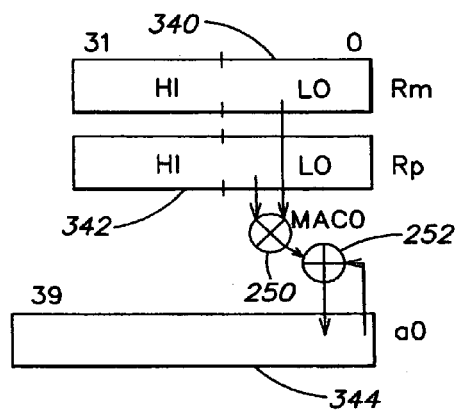
FIGS. 6A–6D schematically illustrate examples of the selection of different operands by one of the multiplier/accumulators.
Figure 6B:
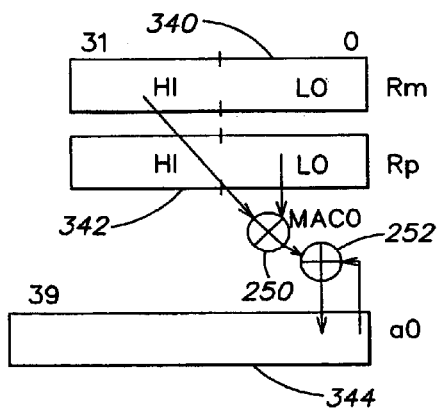
Figure 6C:
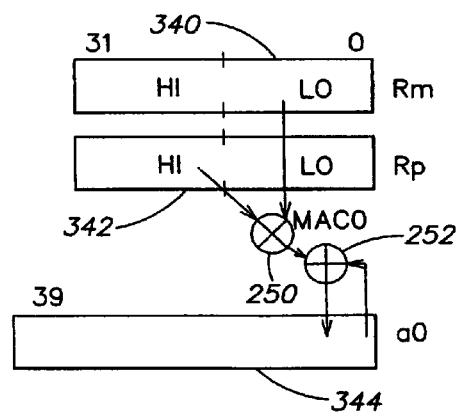
Figure 6D:
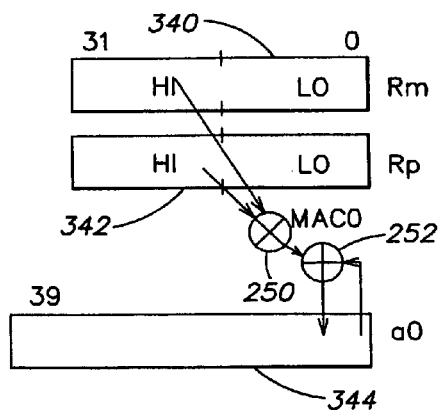

Selection of different operands for computation by execution unit 82 is illustrated in the schematic representations of FIGS. 6A–6D. Like elements in FIGS. 4, 5 and 6A–6D have the same reference numerals. As shown in FIG. 6A, the low operand of data element 340 and the low operand of data element 342 are supplied to multiplier array 250. As shown in FIG. 6B, the high operand of data element 340 and the low operand of data element 342 are supplied to multiplier array 250. As shown in FIG. 6C, the low operand of data element 340 and the high operand of data element 342 are supplied to multiplier array 250. As shown in FIG. 6D, the high operand of data element 340 and the high operand of data element 342 are supplied to multiplier array 250. In each case, the data element 340 appears on operand bus 214 (FIG. 4), and the data element 342 appears on operand bus 216. The selection of operands for multiplier array 250 is made by muxes 300 and 302, as shown in FIG. 4. In the same manner, muxes 310 and 312 perform operand selection for multiplier array 260. The muxes 300, 302, 310 and 312 are controlled by select signals derived from instructions being executed, as described below.

The operand selection technique is described above in connection with dual multiply accumulate (MAC) units. However, since this technique relates to the data movement and selection aspects of computation, it is generally applicable to data selection for any execution unit that performs any arbitrary arithmetic operation. In addition, although the description relates to selection of one of two 16-bit operands, the operand selection technique can be implemented with operands of any width and with two or more operands. When using the operand selection technique, the programmer selects two pairs of adjacent 16-bit data elements that reside in register file 80. When these two pairs of 16-bit data elements are selected and transferred to the execution units 82 and 84 via operand buses 214 and 216, the programmer selects a high or low 16-bit operand from a 32-bit data element to serve as one input to one of the MACs. The other input to the same MAC is a high or low 16-bit operand selected from the other operand bus.

The execution units 82 and 84 also execute instructions which specify ALU operations, i.e., operations which involve addition or subtraction and which do not require the multiplier array or the accumulator. The ALUs 252 and 262 may be configured for performing various ALU operations. In most cases, only one of the ALU's 252 and 262 is active in performing ALU operations. An exception is shown in FIG. 7E and is described below. ALU operations are described in connection with ALU 252 and execution unit 82. It will be understood that the same ALU operations can be performed by ALU 262 in execution unit 84. In one configuration, ALU 252 performs a 32-bit add or subtract and outputs a 32-bit result through result swap mux 280 and output select mux 282 to result bus 226.

Figure 4A:
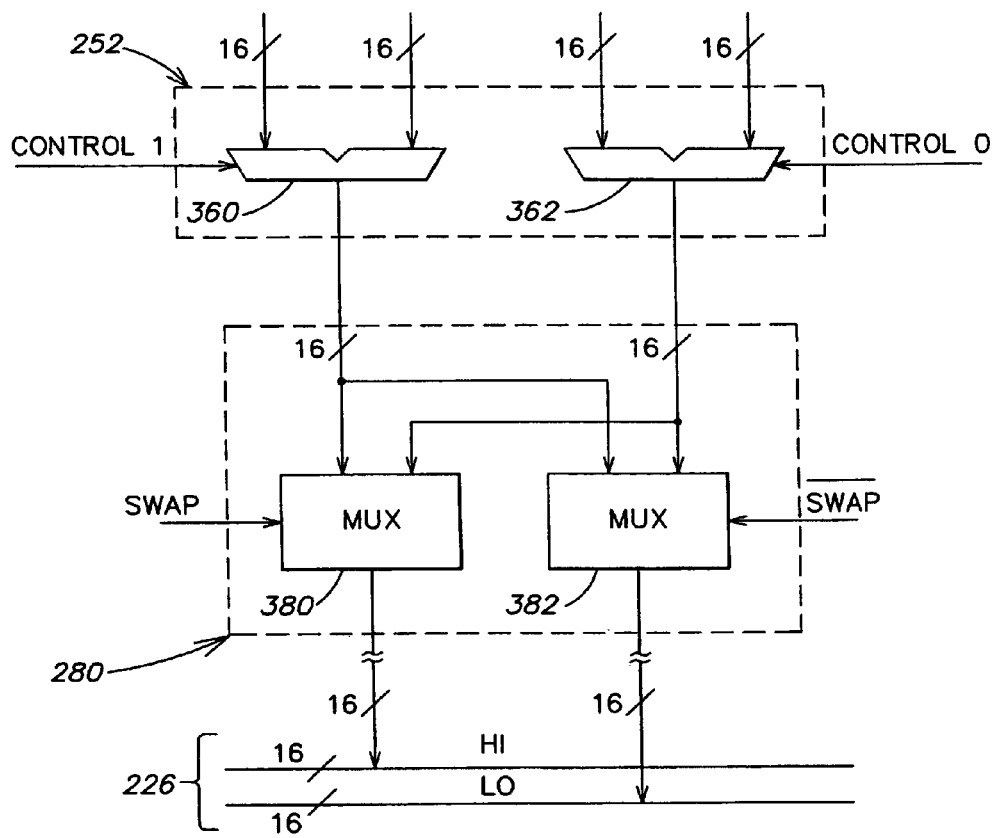
FIG. 4A is a more detailed block diagram of a portion of one of the execution units shown in FIG. 4.
Figure 7A:
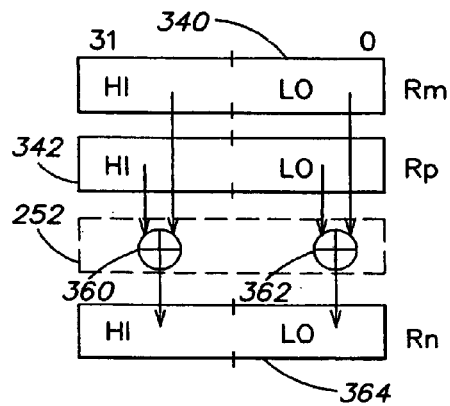
FIGS. 7A–7D schematically illustrate examples of dual 16-bit arithmetic logic unit (ALU) operations which may be performed by the ALUs in the execution units.

The ALU 252 may be configured for performing two 16-bit addition or subtraction operations, as illustrated in FIGS. 7A–7D. In particular, 32-bit ALU 252 is configured to function as two 16-bit ALUs 360 and 362 (FIG. 4A). A 32-bit ALU may be configured as two independent 16-bit ALUs by blocking the carry from bit 15 into bit 16. As shown in FIG. 7A, ALU 360 adds the high operands of data elements 340 and 342 and places the 16-bit result in a high result portion of a data element 364. ALU 362 adds the low operands of data elements 340 and 342 and places the result in a low result portion of data element 364. The 32-bit data element 364 is supplied on result bus 226 to register file 80.

Figure 7B:
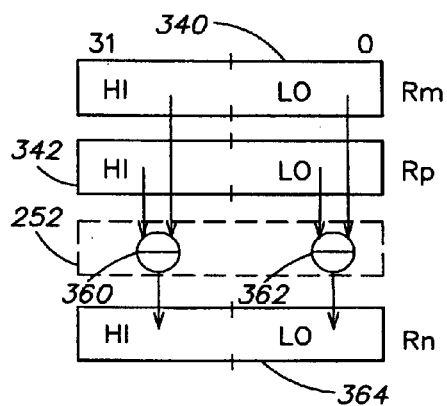
Figure 7C:
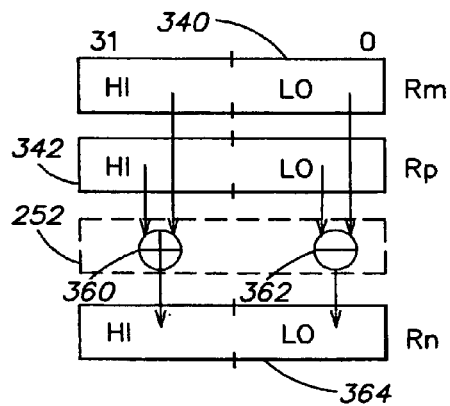
Figure 7D:
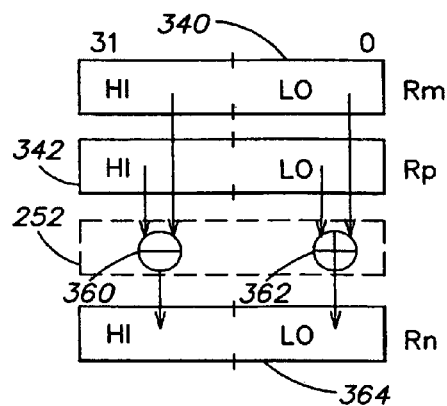
Figure 7E:
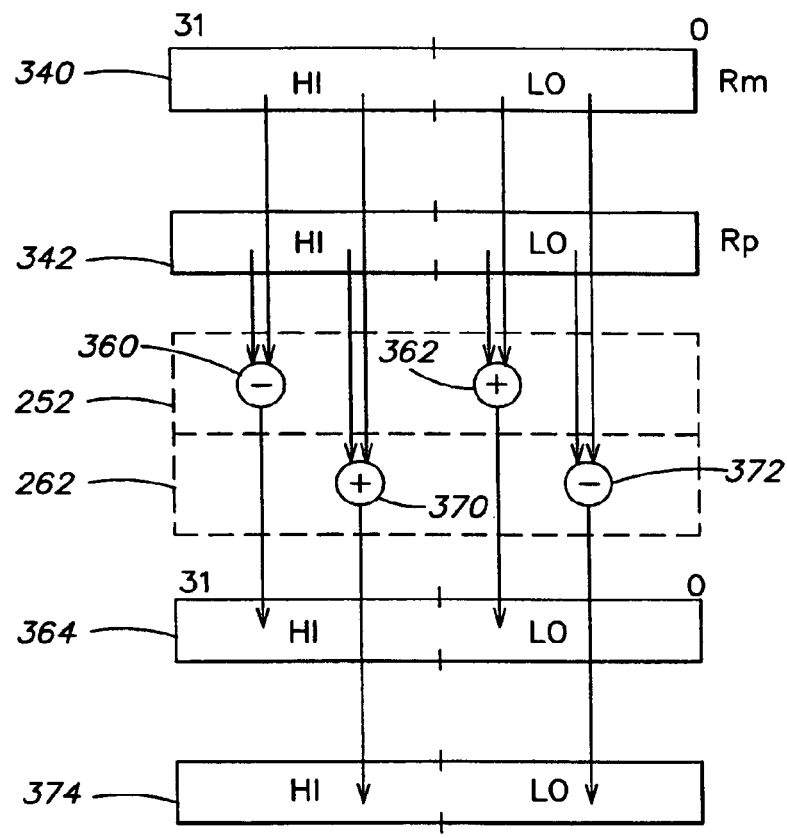
FIG. 7E schematically illustrates an example of a quad 16-bit ALU operation which may be performed by the ALUs in the execution units.

FIGS. 7A, 7B, 7C and 7D illustrate the fact that 16-bit ALUs 360 and 362 are separately programmable in response to control 1 and control 0 signals (FIG. 4A), and may perform the same or different operations. FIG. 7A illustrates the case where ALU 360 and ALU 362 both perform add operations. FIG. 7B illustrates the case where ALU 360 and ALU 362 both perform subtract operations. FIG. 7C illustrates the case where ALU 360 performs an add operation and ALU 362 performs a subtract operation. FIG. 7D illustrates the case where ALU 360 performs a subtract operation and ALU 362 performs an add operation. The control 1 and control 0 signals are supplied from instruction decoder 132 (FIG. 1) in response to decoding of an instruction being executed.

As described above, ALU operations typically utilize only one of the execution units 82 and 84. An exception is described with reference to FIG. 7E. In this configuration, the sum and the difference of each pair of 16-bit operands is generated. The 16-bit ALU 360 subtracts the high operands of data elements 340 and 342 and places the result in the high result portion of data word 364. The 16-bit ALU 362 adds the low operands of data elements 340 and 342 and places the result in the low result portion of data element 364. This configuration further utilizes 32-bit ALU 262 in execution unit 84 configured as 16-bit ALUs 370 and 372. The 16-bit ALU 370 adds the high operands of data elements 340 and 342 and places the result in a high result portion of a data element 374. The 16-bit ALU 372 subtracts the low operands of data elements 340 and 342 and places the result in a low result portion of data element 374. Data element 374 is supplied on result bus 224 to register file 80. In this configuration, execution units 82 and 84 simultaneously perform four 16-bit ALU operations.

FIGS. 7A–7D illustrate a configuration where 16-bit ALU 360 and 16-bit ALU 362 are separately programmable and the operations performed by ALUs 360 and 362 may be the same or different. As described below in connection with FIG. 10, an ALU instruction includes operation fields which specify the individual operations to be performed by ALUs 360 and 362. This individual control feature is generally applicable to any execution units that perform two or more operations simultaneously. Thus, for example, the multiplier accumulators in execution units 82 and 84 are individually controllable and may perform the same or different operations. As described below in connection with FIG. 9, a multiplier accumulator instruction includes operation fields which individually specify the operations to be performed by execution units 82 and 84. The individual control feature can be implemented with execution units of any type or width, and with two or more execution units, or with a single execution unit having two or more computation devices.

Figure 8:
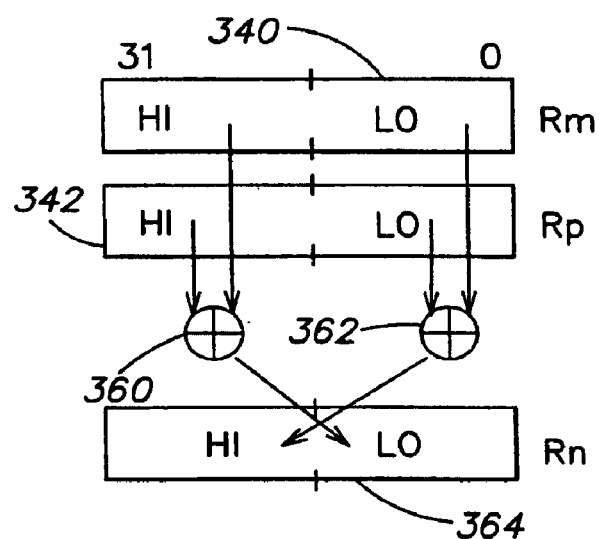
FIG. 8 schematically illustrates the swapping of results produced by the ALUs.

A further feature of execution units 82 and 84 is described with reference to FIGS. 4A and 8. As shown, the results generated by 16-bit ALUs 360 and 362 may be reversed, or swapped, with respect to their placement in 32-bit data element 364. Specifically, the output of ALU 360 is supplied to the low result portion of data element 364, and the output of ALU 362 is supplied to the high result portion of data element 364. This reversed or swapped configuration is contrasted with the configuration of FIGS. 7A–7D, where the output of ALU 360 is supplied to the high result portion of data element 364 and the output of ALU 362 is supplied to the low result portion of data element 364. The reversal or swapping of the outputs of ALUs 360 and 362 is performed by result swap mux 280 (FIG. 4) in response to information contained in an instruction. The result swapping operation at the output of ALUs 360 and 362 is useful, for example, to achieve conjugation in complex arithmetic.

As shown in FIG. 4A, result swap mux 280 may include a mux 380, which is controlled by a swap signal, and a mux 382, which is controlled by an inverted swap signal. Each of the muxes 380 and 382 receives the 16-bit results from ALUs 360 and 362. When the swap signal is not asserted, the output of ALU 360 is supplied to the high result portion of result bus 226, and the output of ALU 362 is supplied to the low result portion of result bus 226. When the swap signal is asserted, the output of ALU 360 is supplied to the low result portion of result bus 226, and the output of ALU 362 is supplied to the high result portion of result bus 226, thereby swapping the outputs of ALUs 360 and 362. In FIG. 4A, output select mux 282 (FIG. 4) is omitted for simplicity of illustration.

The result swapping technique is described above in connection with swapping of ALU outputs. However, since this technique relates to the data movement aspects of computation, it is generally applicable to result swapping for any execution unit that produces two or more results. As described below in connection with FIG. 10, an ALU instruction includes a field which specifies whether or not the results of the ALU operations are to be swapped. The result swapping technique can be implemented with results of any width and with two or more results.

Figure 9:
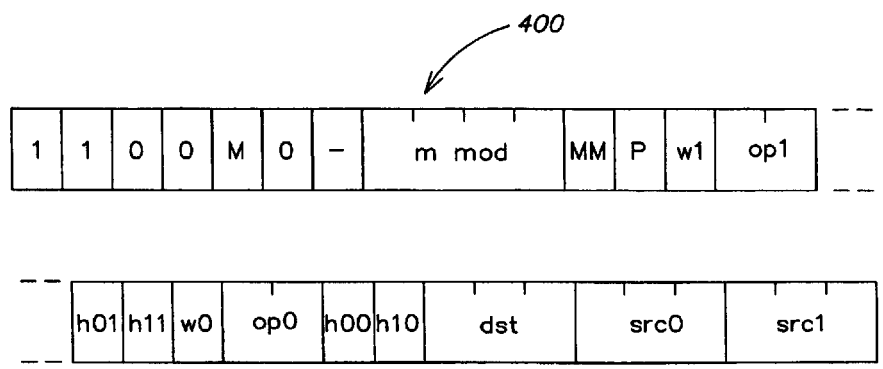
FIG. 9 schematically illustrates an example of a 32-bit DSP multiply accumulate instruction format that may be used in the computation core of FIG. 1.

An example of a DSP type MAC instruction format for controlling execution units 82 and 84 to perform multiply accumulate operations is shown in FIG. 9. A multiplier accumulator instruction 400 has a 32-bit format, with the fields of the instructions as shown in FIG. 9. Source fields, src0 and src1, each having three bits, identify the registers in register file 80 which are to provide the operands for the computation on operand buses 214 and 216 (FIG. 4). A three bit destination field, dst, identifies the register in register file 80 where the result of the computation is to be stored. Operation fields, op0 and op1, each having two bits, indicate the operations to be performed by execution units 82 and 84, respectively. The operations include multiply, multiply-add, multiply-subtract and no operation. The multiply-add and multiply-subtract operations are MAC operations. A P field indicates whether the result is to be written to a single register or written to a register pair. Two w fields w1, and w0, indicate whether the result is to be accumulated only or accumulated and written to a register. The w1 field applies to execution unit 82, and the w0 field applies to execution unit 84. An h00 field indicates whether to select the high operand or the low operand of source 0 (src0) for execution unit 82. An h10 field indicates whether to select the high operand or the low operand of source 1 (src1) for execution unit 82. An h01 field indicates whether to select the high operand or the low operand of source 0 for execution unit 84. An h11 field indicates whether to select the high operand or the low operand of source 1 for execution unit 84. Thus, the h00 and h10 fields control muxes 300 and 302, respectively, at the inputs to execution unit 82, and the h01 and h11 fields control muxes 310 and 312, respectively, at the inputs to execution unit 84. An MM field indicates whether or not execution unit 84 is in mixed mode (signed/unsigned). An mmod field indicates fraction or integer operation, signed or unsigned operation, round or truncate operation and scaled or unscaled operation. An M field indicates whether or not two load/store instructions follow the instruction.

Figure 10:
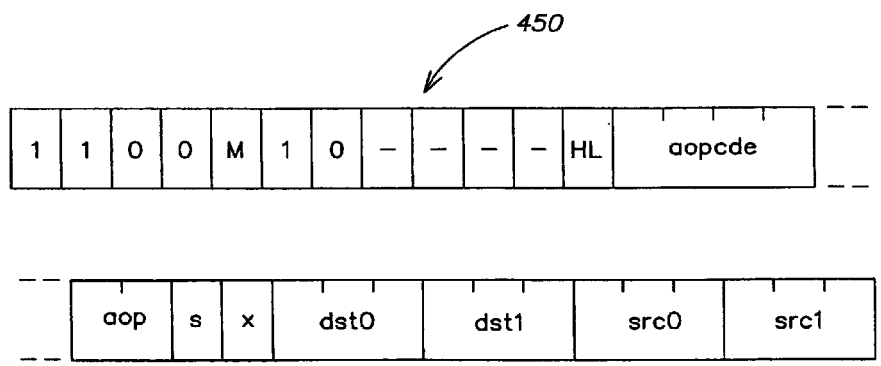
FIG. 10 schematically illustrates an example of a 32-bit ALU instruction format that may be used in the computation core of FIG. 1.

An example of a DSP type ALU instruction format for controlling execution units 82 and 84 to perform ALU operations is shown in FIG. 10. An ALU instruction 450 has a 32-bit format. As in the case of the multiply accumulate instruction, the M field indicates whether or not two load/store instructions follow the instruction. An operation code field, aopcde, is used in conjunction with a secondary op code field, aop, to specify a particular arithmetic operation. Examples include single 16-bit ALU operations, single 32-bit ALU operations, dual 16-bit ALU operations and quad 16-bit ALU operations, as well as other arithmetic operations known to those skilled in the art. Source fields, src0 and src1, each having 3 bits, specify the source registers in register file 80 containing 32-bit data elements for the computation. Destination fields, dst0 and dst1, each having 3 bits, specify the destination registers in register file 80 for storing the results of the computation. An HL field indicates whether the result of a single ALU operation is to be deposited in the high half or the low half of the destination register. An x field indicates whether or not two 16-bit results are to be swapped as they are deposited in the destination register. The value contained in the x field controls the operation of result swap mux 280 (FIG. 4A) as described above. An s field determines whether saturation is active or inactive.

In the case of a single 16-bit add or subtract, the aop field indicates the two operands that are to be added or subtracted, i.e., low and low; low and high; high and low; or high and high. The HL field indicates whether the 16-bit result is to be deposited in the high or low half of the destination register. In the case of a dual 16-bit add or subtract, the aop field indicates the two operations to be performed by the two 16-bit ALUs, i.e., add/add; add/subtract; subtract/add; or subtract/subtract. In the dual 16-bit add or subtract operations, the aop field controls the individual operations performed by ALUs 360 and 362 (see FIGS. 7A–7D). In the case of quad 16-bit add or subtract operations, the aop field controls the operations performed by 16-bit ALUs 360, 362, 370 and 372 (FIG. 7E). The possible operations are add/add for one execution unit and subtract/subtract for the other execution unit, or add/subtract for one execution unit and subtract/add for the other execution unit, to avoid redundant calculations. The aopcde field in instruction 450 may also specify a 32-bit add or subtract operation.

The instruction formats shown in FIGS. 9 and 10 and described above are DSP instructions. These instructions are characterized by a high degree of flexibility and include optional features to permit efficient digital signal processor computations.

Figure 11:
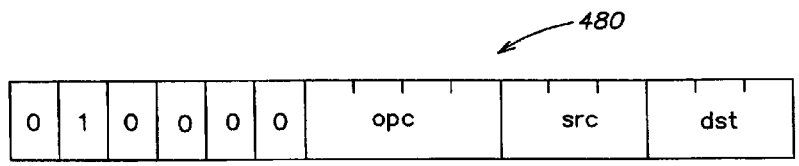
FIG. 11 schematically illustrates an example of a 16-bit microcontroller instruction format that may be used in the computation core of FIG. 1.

An example of a microcontroller type instruction format for controlling execution units 82 and 84 to perform arithmetic operations is shown in FIG. 11. An instruction 480 has a length of 16 bits and contains only three fields, a 4-bit operation code field, opc, a 3-bit source field, src, and a 3-bit destination field, dst. The input operands are taken from the registers in register file 80 specified by the src and dst fields. The result of the computation is placed in the register specified by the dst field, thereby overwriting one of the operands. The operation code field, opc, may specify add, subtract, multiply, as well as other arithmetic operations known to those skilled in the art. It may be observed that instruction 480 is relatively simple and has only three fields that may be specified by the programmer. However, because instruction 480 has a length of 16 bits, it occupies only half of the memory space that is occupied by the more complex DSP instructions described above.

As described above, code density is an important factor in microcontroller applications. A typical microcontroller application may have a relatively large number of instructions requiring relatively simple computations and data handling. Because the number of instructions in a microcontroller application may be large, code density is an important factor in minimizing memory requirements. By contrast, DSP applications typically include a relatively small number of instructions which may be executed repetitively in performing DSP computations. Thus, code density is less important than efficient execution in achieving high performance in DSP applications. By providing instruction formats of the type described above in connection with FIGS. 9–11, microcontroller and DSP functions may be combined efficiently in a single computation core. A combined application typically includes a relatively large number of 16-bit microcontroller instructions and a relatively small number of 32-bit DSP instructions, thereby achieving a high degree of code density. The relatively small number of DSP instructions can be optimized for the highest performance in executing DSP computations.

Figure 12:
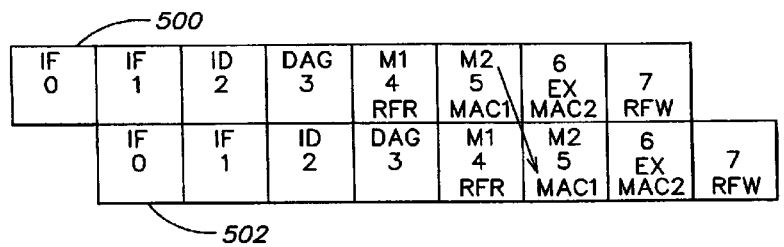
FIG. 12 schematically illustrates the operation of the pipeline in the computation core of FIG. 1.
Figure 14A:
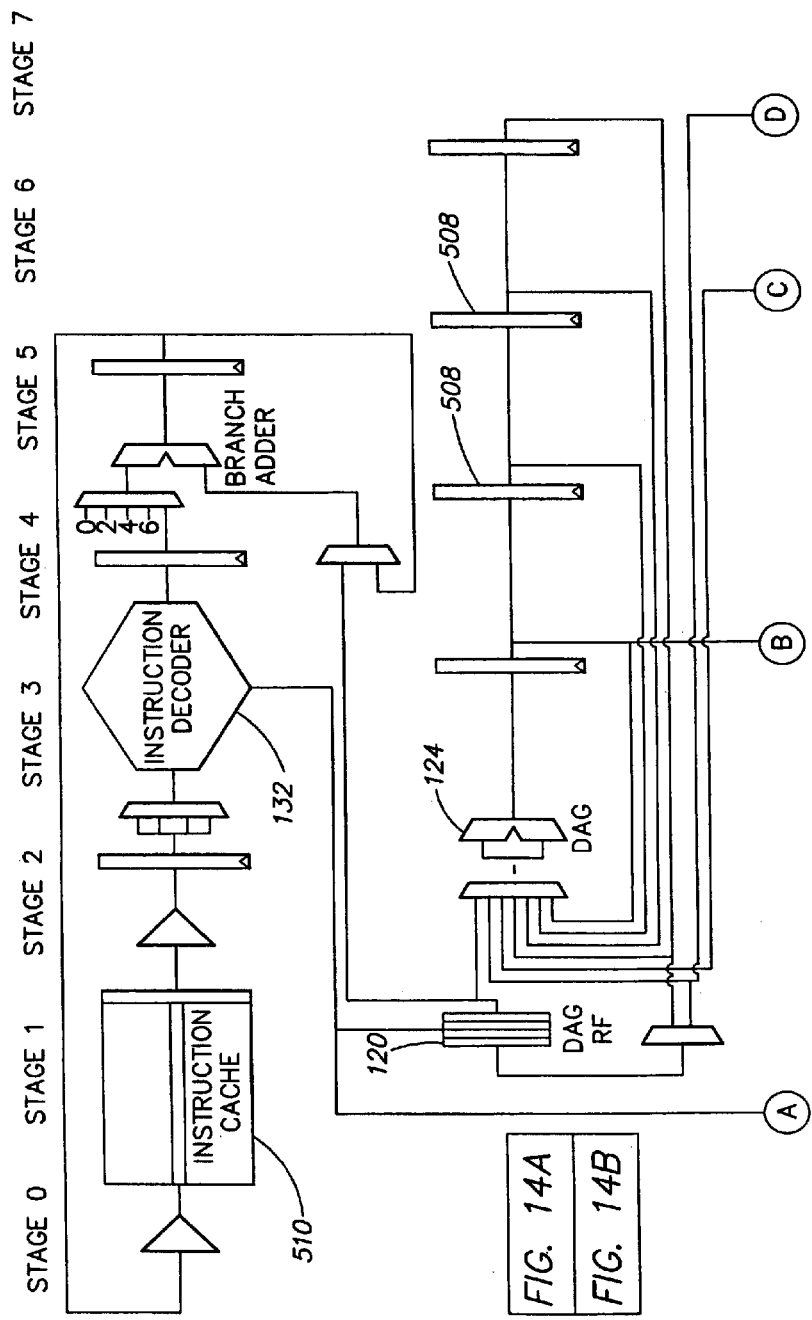
FIG. 14 is a block diagram that illustrates an embodiment of the pipeline structure in the computation core of FIG. 1.
Figure 14B:
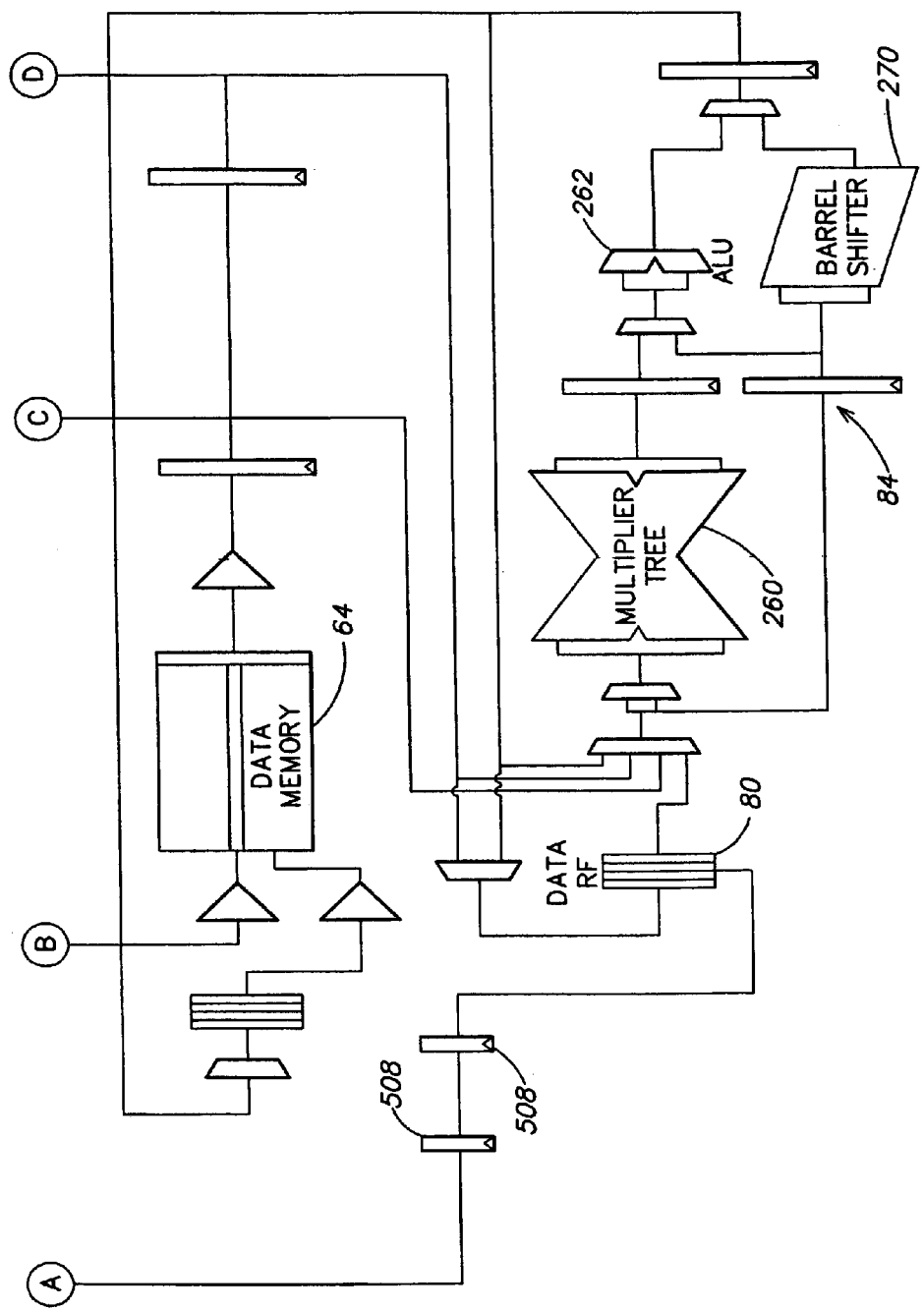

The computation core 10 preferably has a pipeline architecture, as illustrated in FIGS. 12 and 14. In the embodiment of FIGS. 12 and 14, the pipeline has eight stages. In a pipeline architecture, each stage performs a specified function of instruction execution, permitting multiple instructions to be executed simultaneously, with each instruction having a different phase of execution. FIG. 12 is a pipeline timing diagram wherein a horizontal row of blocks represents the functions performed by the different stages of the pipeline in executing a single instruction. Thus, row 500 represents execution of a first instruction, and row 502 represents execution of a second instruction. Vertically aligned blocks represent functions that are performed simultaneously by different stages in the pipeline.

In FIG. 12, stages 0 and 1 perform instruction fetch (IF) from an instruction cache 510 (FIG. 14). Stage 2 performs instruction decoding (ID) in instruction decoder 132. Stage 3 performs data address generation (DAG) in DAG 124. Stages 4 and 5 perform data memory access (M1 and M2) in memory 64. The instruction fetch, instruction decode, data address generation and memory access functions are performed by the control section of computation core 10, including instruction sequencer 50 and addressing block 26 (FIG. 1). Stages 4–7 include operations performed by computation block 24. Stage 4 performs register file read (RFR) from register file 80. Stages 5 and 6 perform multiply accumulate operations (MAC 1 and MAC2) in execution units 82 and 84. In particular, the MAC 1 operation of stage 5 is executed by multiplier arrays 250 and 260, and the MAC2 operation of stage 6 is executed by ALUs 250 and 262 and accumulators 254 and 264. Arithmetic logic and shift operations (EX) of stage 6 are executed by ALUs 252 and 262 or barrel shifter 270. The stage 7 operation is a register file write (RFW) from execution units 82 and 84 to register file 80. In the pipeline structure shown in FIG. 14, pipeline stages are separated by latches 508 controlled by a system clock, as known in the art.

The pipeline shown in FIGS. 12 and 14 and described above is optimized for achieving high performance when executing DSP code. A feature of the pipeline is that memory access operations (M1 and M2), such as loads and stores, occur early in the pipeline relative to the computation operations (EX, MAC1 and MAC2), thus achieving early memory access. In FIG. 12 this is illustrated by the arrow from the end of the second memory access stage (M2) in row 500 to the beginning of the first computation stage (MAC1) in row 502. The arrow represents a register file bypass operation wherein data loaded from memory is supplied directly to execution units 82 and 84, and register file 80 is bypassed. In DSP code, an instruction sequence of a load instruction followed by a multiply accumulate (MAC) is very common. The pipeline organization shown in FIGS. 12 and 14 does not produce any stalls in executing this sequence. It may be noted that in order to organize the pipeline in this manner, the memory access operations (DAG, M1, and M2) occur relatively early in the pipeline and result in two idle pipeline stages, stages 6 and 7, in the control section of the computation core. Also, the computation operations (MAC1 and MAC2) occur relatively late in the pipeline and result in one idle stage (DAG), stage 3, in the computation block 24 of the computation core.

Figure 13:
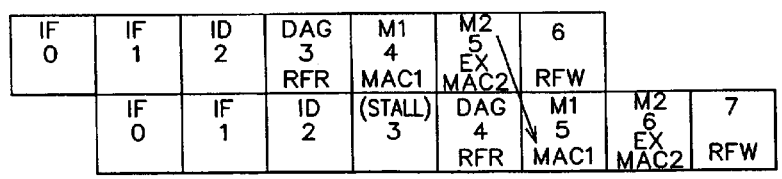
FIG. 13 schematically illustrates the operation of a prior art pipeline.

A timing diagram for a conventional pipeline is illustrated in FIG. 13. As shown, memory access operations (DAG, M1, and M2) occur late in the pipeline relative to the computation operations (MAC1 and MAC2). In particular, memory access operations (M1 and M2) and computation operations (MAC1 and MAC2) both occur in stages 4 and 5. As a result, a one cycle stall is required between a load instruction and a computation instruction that immediately follows the load instruction. The stall may have a significant impact on performance where the sequence of instructions is contained in a loop that is executed multiple times. By contrast, the pipeline structure shown in FIGS. 12 and 14 does not require a stall between a load instruction and a computation instruction.

The early memory access pipeline structure shown in FIG. 12 has advantages in comparison with the prior art pipeline structure shown in FIG. 13. Load-to-use latencies in processors with execution units that have multiple pipeline stages are eliminated. Normally, processors with this type of execution unit suffer from load-to-use latencies. Elimination of load-to-use latencies results in simpler software that does not require loop unrolling or software pipelining, which are software techniques used to improve performance in processors with load-to-use latencies. Even when these techniques are applied, the performance of a conventional processor may be lower than that of the pipeline structure shown in FIGS. 12 and 14 and described above.

As noted above, the computation core structure described herein facilitates efficient digital signal computations. One example of a DSP algorithm that may be implemented efficiently on computation core 10 is a finite impulse response (FIR) digital filter. An FIR filter may be defined mathematically as $$z(n) = \sum_{k=0}^{L-1} c(k)x(n+k), \qquad (1)$$

where x(n) are samples of an input signal, c(k) are L filter coefficients and z(n) are output signal samples. Each output z(n) is obtained by computing the vector product of L samples of the input signal x(n) times L filter coefficients c(k) and summing the products. All signals and coefficients are 16-bit data values in this example.

The dual multiply accumulate operations shown in FIGS. 5 and 6A–6D and described above, may be utilized to perform FIR filter computations. In particular, execution units 82 and 84 may be utilized to perform two multiply accumulate operations simultaneously. In order to perform two multiply accumulate operations, a conventional implementation of an FIR filter on a DSP with dual execution units would require that a total of four data values be loaded from memory: two input values from x(n) and two filter coefficients from c(n). These data loads are achieved by loading a pair of adjacent data values and a pair of adjacent filter coefficient values.

A problem with this technique is that for half of the total number of memory accesses, the pairs of data values must come from locations that are not 32-bit aligned in memory. That is, the memory must be able to deliver data elements x(0) and x(1) into a register in an aligned 32-bit access, and must also be able to deliver data elements x(1) and x(2) to a register in a misaligned 32-bit access. Note that either the data elements x(n) or the coefficients c(n) must be accessed as misaligned 32-bit element pairs, but not both. One of these signals may always be accessed as 32-bit aligned pairs, and here it is assumed that coefficients c(n) are accessed as aligned 32-bit pairs. The delivery of misaligned 32-bit element pairs in prior art systems requires two memory accesses and, therefore, is relatively inefficient.

A novel FIR filter implementation avoids misaligned 32 bit data accesses as follows. Let execution unit 82 (MAC0) compute all of the even indexed outputs and execution unit 84 (MAC 1) compute all of the odd indexed outputs. For example, outputs z(0) through z(3) may computed as follows.

$$z(0) = x(0) \cdot c(0) + x(1) \cdot c(1) + x(2) \cdot c(2) + \ldots \quad (2)$$

$$z(1) = x(1) \cdot c(0) + x(2) \cdot c(1) + x(3) \cdot c(2) + \ldots \quad (3)$$

$$z(2) = x(2) \cdot c(0) + x(3) \cdot c(1) + x(4) \cdot c(2) + \ldots \quad (4)$$

$$z(3) = x(3) \cdot c(0) + x(4) \cdot c(1) + x(5) \cdot c(2) + \ldots \quad (5)$$

where execution units 82 computes z(0) and z(2), and execution unit 84 computes z(1) and z(3).

Figure 15A:
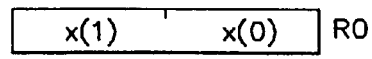
FIGS. 15A–15C schematically illustrate the operation of an FIR digital filter algorithm that may run efficiently on the computation core of FIG. 1.
Figure 15A:
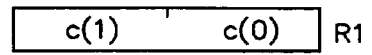

Assume that data sample pair x(0) and x(1) is loaded into register R0, as shown in FIG. 15A, and coefficient pair c(0) and c(1) is loaded into register R1. Two multiply accumulates are computed using the 16-bit operand selection method as follows.

$$z(0)+=x(0) \cdot c(0), \text{ and } z(1)+=x(1) \cdot c(0), \quad (6)$$

where the symbol "+=" represents the multiply accumulate operation. The value z(0) is computed in execution unit 82, and the value z(1) is computed in computation unit 84. Both memory accesses illustrated in FIG. 15A are 32-bit aligned.

Figure 15B:
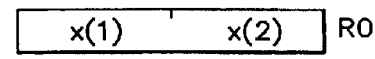
Figure 15B:
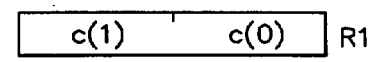

Next, rather than loading a data pair, a single data sample x(2) is loaded into the low half of register R0, as shown in FIG. 15B. It may be noted that the high half of register R0 and all of register R1 remain unchanged. Two multiply accumulates may now be computed as follows.

$$z(0)+=x(1) \cdot c(1), \text{ and } z(1)+=x(2) \cdot c(1) \quad (7)$$

Again, the value z(0) is computed in execution unit 82, and the value z(1) is computed in execution unit 84.

Figure 15C:
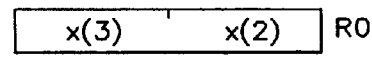
Figure 15C:
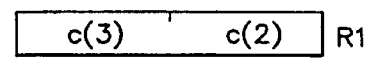

For the next set of two multiply accumulate computations, coefficient pair c(2) and c(3) is loaded into register R1 and a single data sample x(3) is loaded into the high half of register R0, as shown in FIG. 15C. The low half of register R0 is not changed. The two multiply accumulate computations are performed as follows.

$$z(0)+=x(2) \cdot c(2), \text{ and } z(1)+=x(3) \cdot c(2), \quad (8)$$

where the value of z(0) is computed in execution unit 82, and the value of z(1) is computed in execution unit 84.

With this technique, not only are all accesses aligned, but the execution units 82 and 84 are able to obtain all of the required input operands from only two 32-bit registers in the register file. This is the reason why this technique can be implemented in the architecture with high or low operand selection as described above. The inputs are loaded into register halves in a "ping pong" sequence. Without this ping pong sequence, the register file would be required to supply four 16-bit data elements to the execution units, rather than two 32-bit data elements (in addition to the filter coefficients), which would result in a more complex register file.

A pseudo-code representation of an algorithm for performing FIR digital filter computations as described above is shown in FIG. 16. The algorithm includes an outer loop and an inner loop. The outer loop is executed M/2 times, where M is the number of input data samples in the data set. Since two output values are computed on each pass of the outer loop, M/2 iterations are required. In the outer loop, a 16-bit data element x(0) is loaded into register RL0, the lower half of register R0, and the inner loop is executed L times, where L is the number of coefficients in the FIR filter.

The inner loop performs the multiply accumulate operations for values of an index variable k for values of k from 0 to L-1. In the inner loop, a 16-bit data element x(n+k+1) is loaded into register RH0, the high half of register R0. Two 16-bit coefficients c(k+1) and c(k) are loaded into register R1. The multiply accumulate value z(n+1) is computed in execution unit 84, and the result is stored in accumulator A1. The multiply accumulate value z(n) is computed in execution unit 82, and the result is stored in accumulator A0. Next, a 16-bit data element x(n+k+2) is loaded into register RL0, the low half of register R0, and the multiply accumulate values z(n+1) and z(n) are computed. As noted above, the inner loop is executed L times.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A method for determining an output of a finite impulse response digital filter having L filter coefficients in response to a set of M input samples, comprising the steps of:
   (a) loading a first input sample into a first location in a first register;
   (b) loading a second input sample into a second location in said first register while leaving a value of the first location in said first register unchanged;
   (c) loading two aligned coefficients into a second register;
   (d) computing two or more intermediate results using contents of the first and second registers,
   (e) loading a new input sample into the first location in said first register while leaving a value of the second location in said first register unchanged;
   (f) computing two or more intermediate results using contents of the first and second registers;

(g) repeating steps (b)–(f) for L iterations to provide two or more output samples;

(h) repeating steps (a)–(g) for M/2 iterations to provide M output samples; and wherein each of step (a), (b) and (e) comprises an aligned memory access.

2. A method as defined in claim 1 wherein said input samples and said coefficients are 16 bits each.

3. A method as defined in claim 1 wherein steps (d) and (f) each comprise multiply accumulate operations.

4. A method as defined in claim 1 wherein steps (d) and (f) each comprise selecting operands from the first and second registers in response to computation instructions and performing multiply accumulate operations on the selected operands.

5. A method as defined in claim 1 wherein step (d) comprises a multiply accumulate operation on a first coefficient in said second register and the input sample in the first location in said first register, and a multiply accumulate operation on the first coefficient in said second register and the input sample in the second location in said first register.

6. A method as defined in claim 5 wherein step (f) comprises a multiply accumulate operation on a second coefficient in said second register and the new input sample in the first location in said first register, and a multiply accumulate operation on the second coefficient in said second register and the input sample in the second location in said first register.

* * * * *